United States Patent
Kim et al.

(10) Patent No.: US 7,859,115 B2
(45) Date of Patent: Dec. 28, 2010

(54) SEMICONDUCTOR PACKAGE FOR IMPROVING CHARACTERISTICS FOR TRANSMITTING SIGNALS AND POWER

(75) Inventors: Jong Hoon Kim, Gyeonggi-do (KR); Min Suk Suh, Seoul (KR); Seung Taek Yang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1 day.

(21) Appl. No.: 12/346,963

(22) Filed: Dec. 31, 2008

(65) Prior Publication Data
US 2010/0117208 A1 May 13, 2010

(30) Foreign Application Priority Data
Nov. 7, 2008 (KR) .................. 10-2008-0110456

(51) Int. Cl.
*H01L 23/48* (2006.01)
(52) U.S. Cl. ............... 257/774; 257/777; 257/779
(58) Field of Classification Search ......... 257/770–779; 438/597
See application file for complete search history.

(56) References Cited

U.S. PATENT DOCUMENTS

| 6,812,549 B2 * | 11/2004 | Umetsu et al. ............ 257/621 |
| 2004/0080040 A1 | 4/2004 | Dotta et al. |
| 2007/0048994 A1 * | 3/2007 | Tuttle ......................... 438/597 |

FOREIGN PATENT DOCUMENTS

| JP | 2007-335642 A | 12/2007 |
| JP | 2009-004648 A | 1/2009 |
| KR | 10-0830581 B1 | 5/2008 |
| KR | 10-0879191 B1 | 1/2009 |

\* cited by examiner

*Primary Examiner*—Leonardo Andújar
(74) *Attorney, Agent, or Firm*—Ladas & Parry LLP (57) ABSTRACT

A semiconductor package includes a semiconductor chip having a first region and a second region. Bonding pads are formed and through-holes are defined in the first and second regions. Insulation layers are formed on sidewalls of the through-holes, and through-electrodes formed in the through-holes and connected with corresponding bonding pads. The insulation layers formed in the first and second regions have different thicknesses or dielectric constants.

11 Claims, 6 Drawing Sheets

SEMICONDUCTOR PACKAGE FOR IMPROVING CHARACTERISTICS FOR TRANSMITTING SIGNALS AND POWER

CROSS-REFERENCE TO RELATED APPLICATIONS

The present application claims priority to Korean patent application number 10-2008-0110456 filed on Nov. 7, 2008, which is incorporated herein by reference in its entirety.

BACKGROUND OF THE INVENTION

The present invention relates generally to a semiconductor package, and more particularly to a semiconductor package having multiple types of through-electrodes capable of improving characteristics for transmitting signals and power.

Recent design trends in the semiconductor industry include manufacturing products in such a way as to accomplish weight reduction, device miniaturization, high speed operation, multi-functionality, high performance, high reliability, and low manufacturing cost. Semiconductor package forming technology is considered as one important technology for achieving the above design trends in the semiconductor industry.

Recently, various techniques for a stack package (i.e., two or more semiconductor chips or semiconductor packages being vertically stacked) have been developed in attempts to further miniaturization, high capacity, and high mounting efficiency. The stack package is advantageous in that, products having memory capacity greater than that obtained by a general semiconductor integration process may be realized when utilizing the stack package, and additionally, when implementing the stack package a mounting area utilization efficiency can be increased. The stack package can be manufactured by a first method, in which individual semiconductor chips are stacked and then the stacked semiconductor chips are packaged together, or a second method, in which individual packaged semiconductor chips are stacked and packaged together.

In semiconductor packages including the stack package, electrical connections are produced by metal wires, bumps, or through-electrodes, and the electrical connections are formed between a semiconductor chip, or a semiconductor package, and a substrate, between semiconductor chips, or between semiconductor packages.

Recently, of the above-mentioned various electrical connection forming elements, studies have been conducted with regards to the stack packages manufactured using semiconductor packages which are formed with through-electrodes because electrical degradation can be minimized, operation speed can be increased, and miniaturization can be accomplished when electrical connections are formed through the through-electrodes.

Typically, through-electrodes of a semiconductor package are formed by filling a metallic material into through-holes defined in semiconductor chips. The through-electrodes perform a function of transmitting both signals and power between elements of stacked semiconductor packages.

Typically, insulation layers are formed between the through-holes and the through-electrodes thus preventing the leakage of current to other portions of the semiconductor chips. The insulation layers can adversely influence the high speed operation of the through-electrodes because the insulation layers serve as capacitors due to their arrangement between the portions of the semiconductor chips and the through-electrodes.

Figure 1:
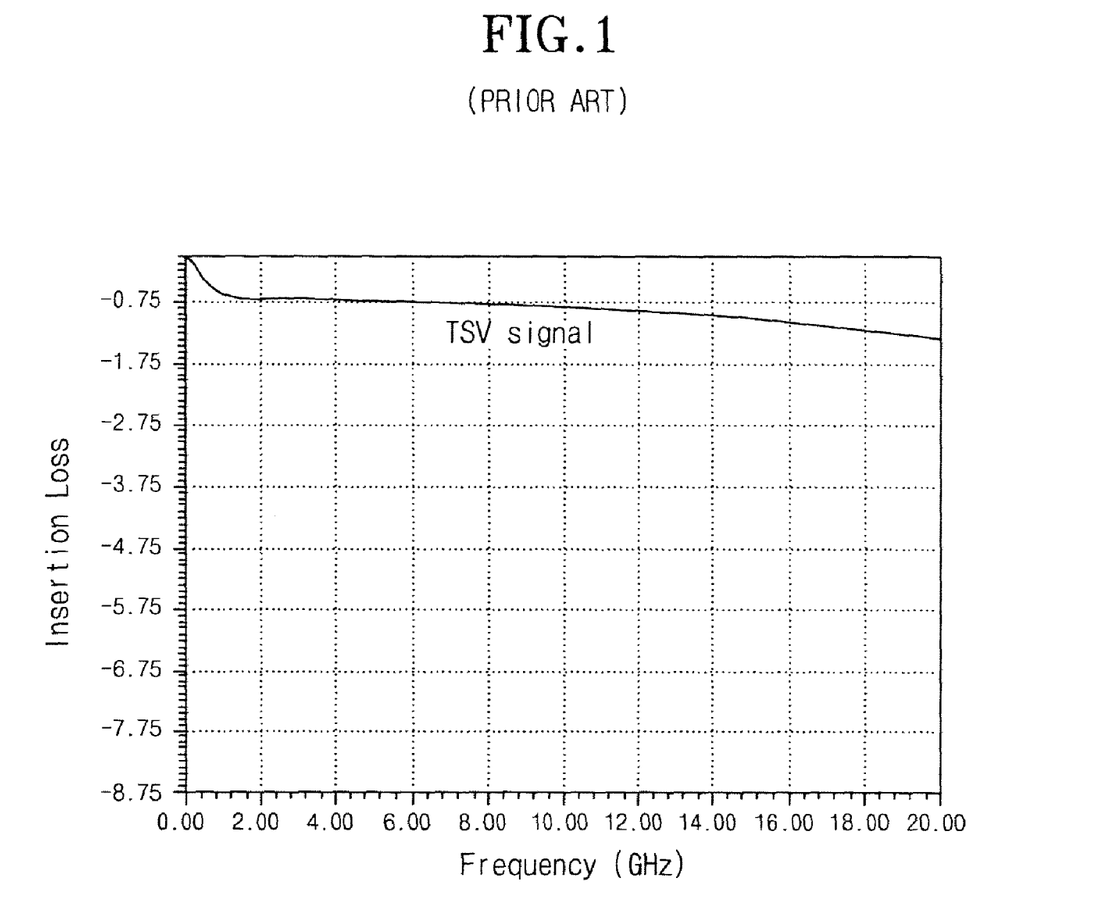
FIG. 1 is a graph showing the relationship between signal loss and frequency in the conventional stack package formed using semiconductor packages having through-electrodes.

FIG. 1 is a graph showing the relationship between signal loss and frequency in the conventional stack package formed using semiconductor packages having through-electrodes.

Referring to FIG. 1, it is to be understood that signal loss through the through-electrodes rapidly increases up to the frequency of 1 GHz due to the presence of the insulation layers serving as capacitors. This is because capacitance increases by the presence of the insulation layers.

Accordingly, when realizing a stack package using through-electrodes, in order to improve the electrical characteristics of the stack package, it is necessary to adjust the capacitance of through-electrodes for signal transmission and the capacitance of through-electrodes for power transmission.

SUMMARY OF THE INVENTION

Embodiments of the present invention include a semiconductor package which has multiple types of through-electrodes capable of improving the transmission characteristics of signals and power.

In one aspect of the present invention, a semiconductor package comprises a semiconductor chip having a first region and a second region in which bonding pads are formed and through-holes are defined; insulation layers formed on sidewalls of the through-holes; and through-electrodes formed in the respective through-holes and connected with respective corresponding bonding pads, wherein the insulation layers have different thicknesses in the first and second regions.

The through-holes in the first and second regions have the same diameter.

The insulation layer in the first region has a thickness larger than that of the insulation layer in the second region such that capacitance of the insulation layer in the first region is smaller than that of the insulation layer in the second region.

The insulation layers in the first region and the second region are formed of the same material.

The through-electrode formed in the first region is to transmit signals, and the through-electrode formed in the second region is to transmit power.

The through-holes are defined to pass through the respective corresponding bonding pads.

In another aspect of the present invention, a semiconductor package comprises a semiconductor chip having a first region and a second region in which bonding pads are formed and through-holes are defined; insulation layers formed on sidewalls of the through-holes; and through-electrodes formed in the respective through-holes and connected with respective corresponding bonding pads, wherein the insulation layers have different dielectric constants in the first and second regions.

The through-holes in the first and second regions have the same diameter.

The insulation layers in the first and second regions have the same thickness.

The insulation layer in the first region is formed of a material having a dielectric constant smaller than that of the insulation layer in the second region such that capacitance of the insulation layer in the first region is smaller than that of the insulation layer in the second region.

The through-electrode formed in the first region is to transmit signals, and the through-electrode formed in the second region is to transmit power.

The through-holes are defined to pass through the respective corresponding bonding pads.

In still another aspect of the present invention, a semiconductor package comprises a semiconductor chip having a first region and a second region in which bonding pads are formed and through-holes are defined; a first layer formed on sidewalls of the through-holes defined in the first region and the second region; a second layer formed on the first layer in the first region; and through-electrodes formed in the respective through-holes and connected with respective corresponding bonding pads, wherein the first layer and the second layer are insulation layers.

DESCRIPTION OF SPECIFIC EMBODIMENTS

Hereafter, specific embodiments of a semiconductor package according to the present invention will be described in detail with reference to the accompanying drawings.

Figure 2:
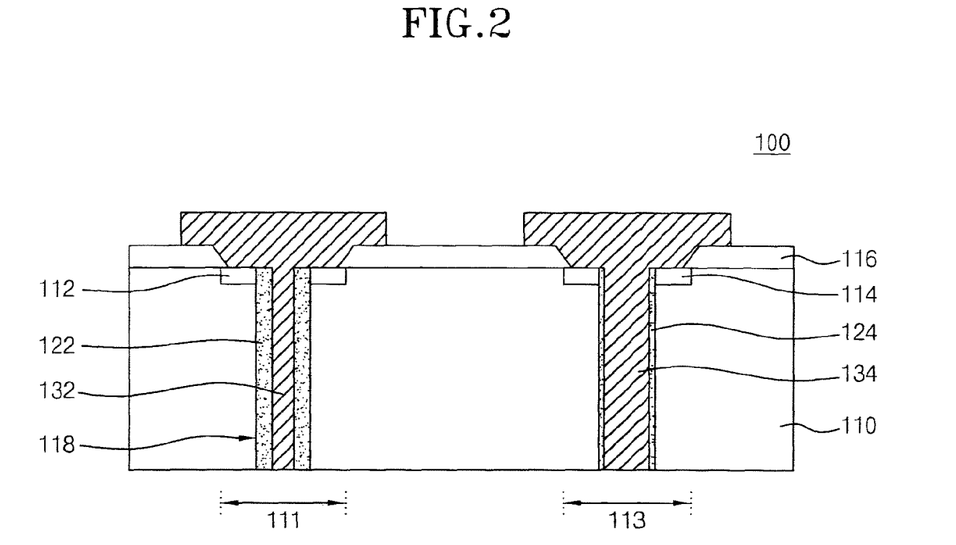
FIG. 2 is a cross-sectional view showing a semiconductor package in accordance with an embodiment of the present invention.

FIG. 2 is a cross-sectional view showing a semiconductor package in accordance with an embodiment of the present invention.

Referring to FIG. 2, the semiconductor package 100 according to the present embodiment includes a semiconductor chip 110 having through-holes 118 defined therein, insulation layers 122 and 124 are formed on the sidewalls of the through-holes 118, and through-electrodes 132 and 134 formed in the through-holes 118. As shown in FIG. 2, according to the present embodiment the insulation layers 122 and 124 are formed to have different thicknesses.

The semiconductor chip 110 has a plurality of bonding pads formed on an upper surface thereof. In detail, the semiconductor chip 110 has a first bonding pad 112 for transmitting signals and a second bonding pad 114 for transmitting power. The semiconductor chip 110 includes a first region 111, which includes the first bonding pad 112 for transmitting signals, and a second region 113, which includes the second bonding pad 114 for transmitting power.

The semiconductor chip 110 also includes a protective layer 116 formed on the upper surface thereof. The protective layer 116 is formed such that it both isolates the semiconductor chip 110 and exposes portions of the bonding pads, including the first and second bonding pads 112 and 114. The through-holes 118, which pass through the upper and lower surfaces of the semiconductor chip 110, are formed have the same diameter. Preferably, the through-holes 118 are defined so as to pass through the first bonding pad 112 arranged in the first region 111 and the second bonding pad 114 arranged in the second region 113.

A first insulation layer 122 is formed on the sidewall of the through-hole 118 defined in the first region 111 of the semiconductor chip 110, and a second insulation layer 124 having a thickness smaller than that of the first insulation layer 122 is formed on the sidewall of the through-hole 118 defined in the second region 113. A first through-electrode 132 and a second through-electrode 134 are formed in the through-holes 118 defined in the first and second regions 111 and 113 such that they are electrically connected with the first and second bonding pads 112 and 114, respectively. The first through-electrode 132 connected with the first bonding pad 112 in the first region 111 functions to transmit signals, and the second through-electrode 134 connected with the second bonding pad 114 in the second region 113 functions to transmit power.

The portions of the semiconductor chip 110 corresponding to the first and second regions 111 and 113, the first and second insulation layers 122 and 124, and the first and second through-electrodes 132 and 134, are configured such that capacitors are formed. As configured, the first insulation layer 122 and the second insulation layer 124 have different values of capacitance depending upon the thicknesses thereof.

That is, the first and second insulation layers 122 and 124 are formed of the same material. The thickness of the first insulation layer 122 is greater than that of the second insulation layer 124, and therefore the capacitance of the first insulation layer 122 is less than that of the second insulation layer 124. The capacitance of a capacitor having a structure including a sequential arrangement of a conductive layer, an insulation layer and a conductive layer decreases as the thickness of the insulation layer increases.

Accordingly, the signal transmission efficiency of the semiconductor package 100 is improved when transmitting signals through the first through-electrode 132 due to the first insulation layer 122 having a large thickness, and the power transmission efficiency of the semiconductor package 100 is improved when transmitting power through the second through-electrode 134 due to the second insulation layer 124 having a small thickness.

Figure 3:
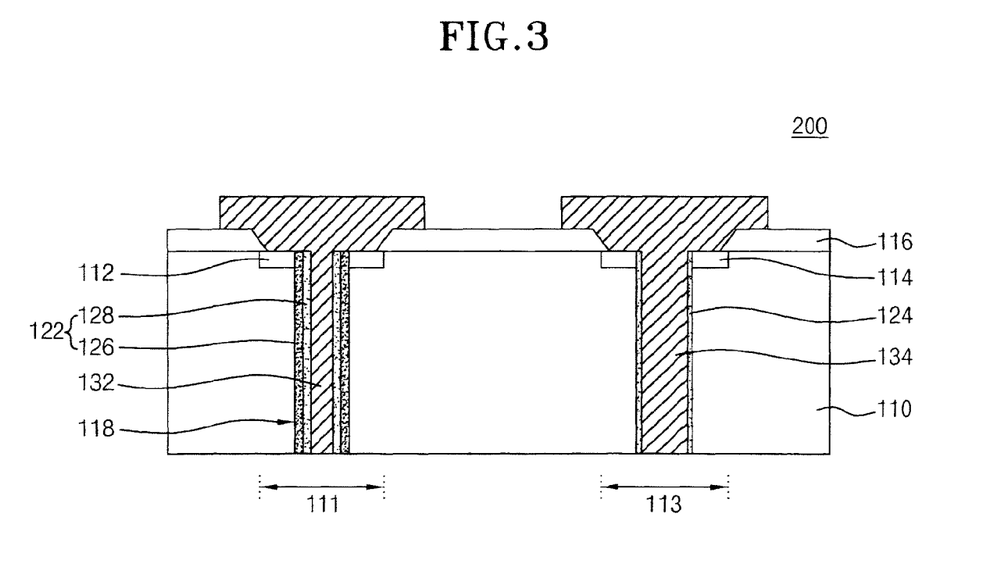
FIG. 3 is a cross-sectional view showing a semiconductor package in accordance with another embodiment of the present invention.

FIG. 3 is a cross-sectional view showing a semiconductor package in accordance with an embodiment of the present invention.

The semiconductor package shown in FIG. 3 has substantially the same component elements as those of the semiconductor package shown and explained with reference to FIG. 2. Therefore, repeated description for the same component elements will be omitted, and the same technical terms and the same reference numerals will be used to refer to the same or like component elements.

Referring to FIG. 3, in the semiconductor package 200 according to the present embodiment, a first insulation layer 122, which transmits signals and has a thickness greater than that of a second insulation layer 124, includes a stack of insulation layers, for example a first layer 126 and a second layer 128 made of different materials.

It should be understood that other through-electrodes may be formed that function differently from the aforementioned through-electrodes of the first and second regions for transmitting signals and power. Such through-electrodes may be formed by forming insulation layers having a predetermined thicknesses determined according to required values of capacitance associated with the functions of the additional through-electrodes.

While the aforementioned through-holes are defined at locations corresponding to locations of the bonding pads, according to an embodiment of the preset invention, the through-holes of the semiconductor chip may also be defined at positions such that the through-holes do not pass through bonding pads. In this case, the through-electrodes formed in the through-holes can be electrically connected with the bonding pads through re-distribution lines or other through-electrodes.

FIGS. 4A through 4F are cross-sectional views shown for illustrating the processes of a method for manufacturing the semiconductor package in accordance with an embodiment of the present invention.

Figure 4A:
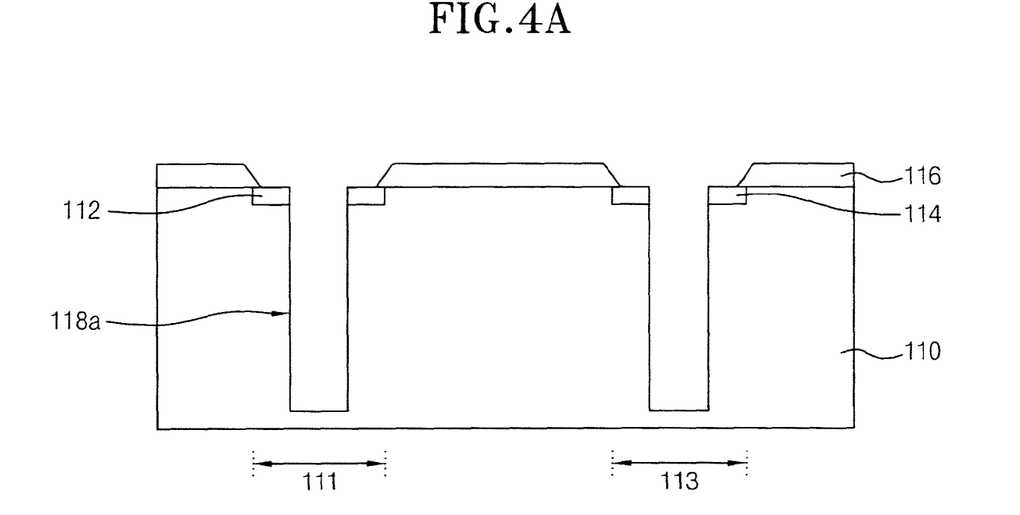
FIGS. 4A through 4F are cross-sectional views shown for illustrating the processes of a method for manufacturing the semiconductor package in accordance with an embodiment of the present invention.

Referring to FIG. 4A, a wafer having semiconductor chips 110 is prepared. Each semiconductor chip 110 of the wafer has a first region 111, including a first bonding pad 112 for transmitting signals, and a second region 113, that includes a second bonding pad 114 for transmitting power. As shown in FIG. 4A, the first and second bonding pads 112 and 114 are formed on an upper surface of the semiconductor chip 110. The semiconductor chip 110 as shown in FIG. 4A further includes a protective layer 116 formed on the upper surface of the semiconductor chip 110 and that exposes portions of the first and second bonding pads 112 and 114. A mask pattern (not shown) is formed on the upper surface of each semiconductor chip 110 so as to expose portions of first and second bonding pads 112 and 114, and subsequently grooves 118a are defined in the semiconductor chip 110 through an etching process to have a predetermined depth.

Figure 4B:
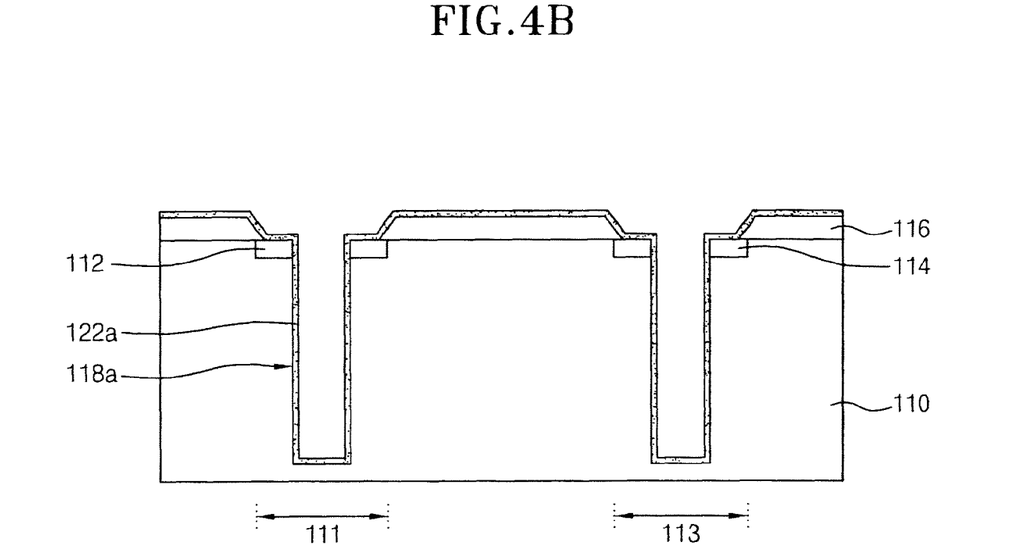

Referring to FIG. 4B, a first layer 122a, serving as an insulation layer, is formed on the upper surface of each semiconductor chip 110 including the protective layer 116 and the first and second bonding pads 112 and 114 and on the surfaces of the semiconductor chip 110 that define the grooves 118a.

Figure 4C:
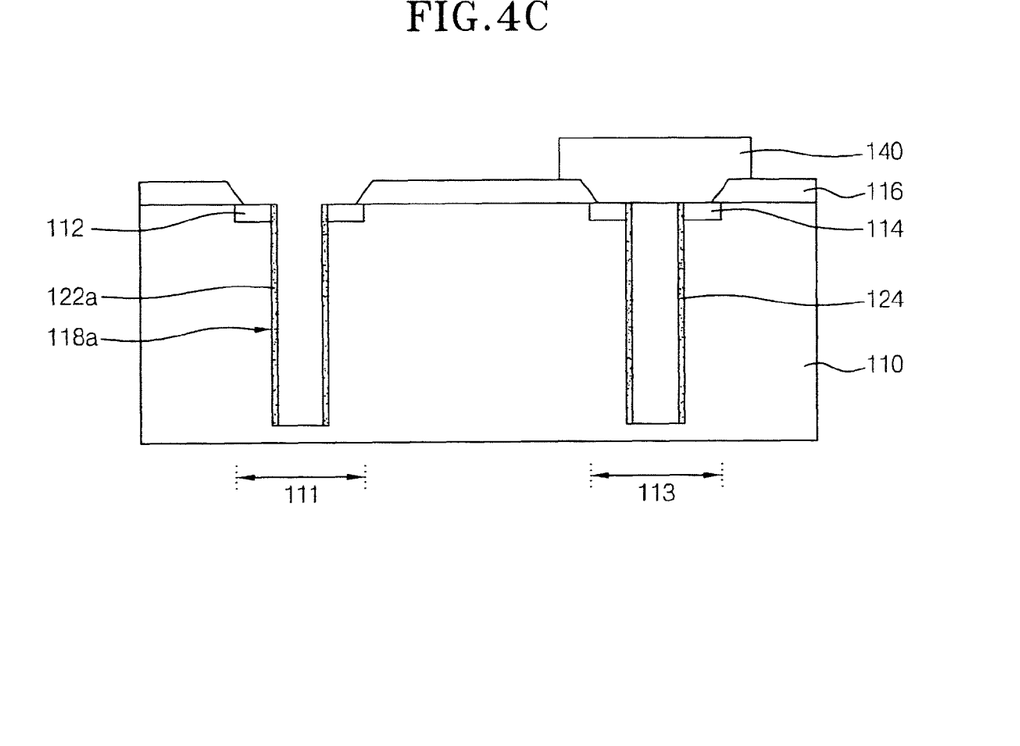

Referring to FIG. 4C, an etch-back process is conducted for the wafer, and through the etch-back process portions of the first layer 122a, which are formed on the bottoms of the grooves 118a and on the upper surface of the semiconductor chip 110 including the protective layer 116 and the first and second bonding pads 112 and 114, are removed. That is, after the etch-back process portions of the first layer 122a remain on the sidewalls of the through-holes 118a defined in the first and second regions 111 and 113 of the semiconductor chip 110. Subsequently, a mask pattern 140 is formed on the semiconductor chip 110 exposing the groove 118a defined in the first region 111, that is, the groove 118a that passes through the first bonding pad 112 for transmitting signals.

Figure 4D:
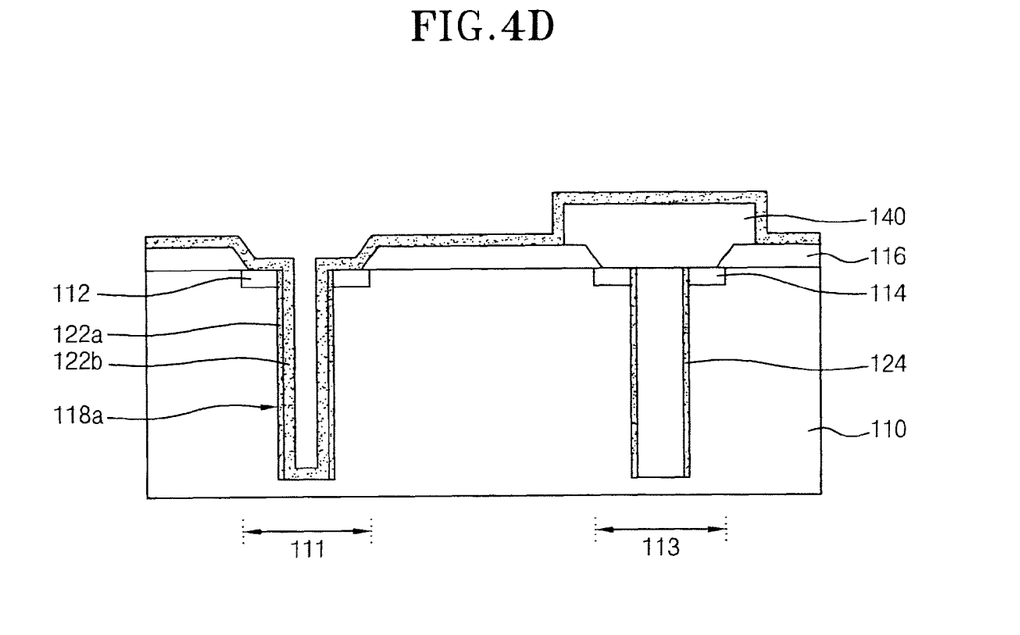

Referring to FIG. 4D, a second layer 122b is formed on the upper surface of each semiconductor chip 110 including the bottom of the groove 118a in the first region 111 and the first layer 122a formed on the sidewall of the groove 118a in the first region 111, using the same material as the first layer 122a, alternatively the second layer 122b may be formed using a material that is different from that of the first layer 122a.

Figure 4E:
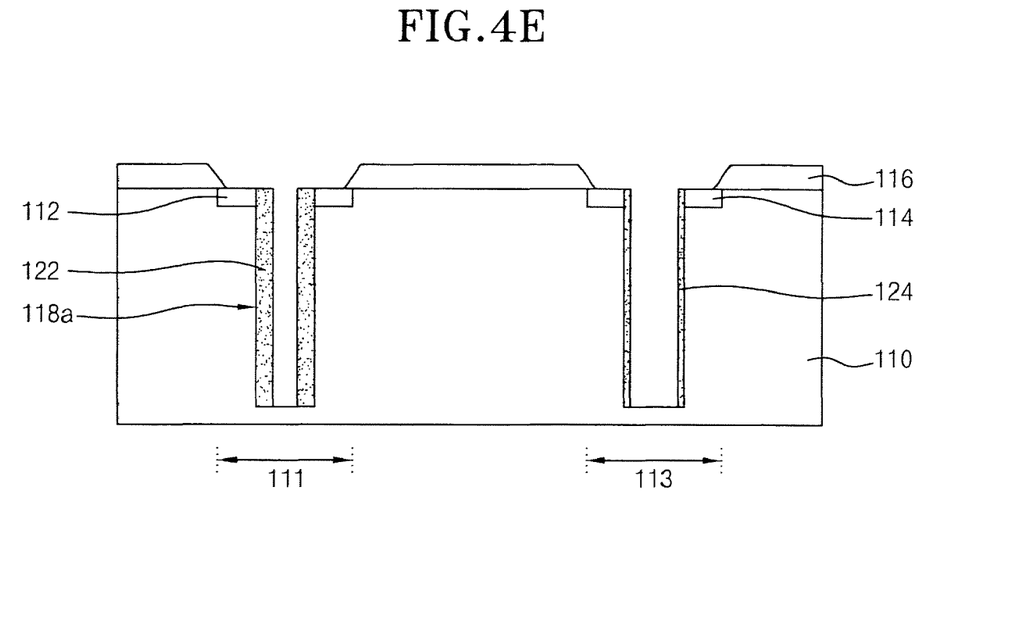

Referring to FIG. 4E, an etch-back process is conducted on the wafer, and through the etch-back process portions of the second layer 122b, which are formed on the bottom of the groove 118a in the first region 111 of each semiconductor chip 110 and on the upper surface of each semiconductor chip 110 including the protective layer 116 and the first and second bonding pads 112 and 114, are removed. That is, after the etch-back process, portions of the second layer 122b remain on the portions of the first insulation layer 122a that remain after the previous etch-back process. Subsequently, the mask pattern 140 formed on each semiconductor chip 110 is removed thereby forming a first insulation layer 122 on the sidewall of the groove 118a defined in the first region 111 and a second insulation layer 124, having a thickness less than that of the first insulation layer 122, on the sidewall of the groove 118a defined in the second region 113.

Figure 4F:
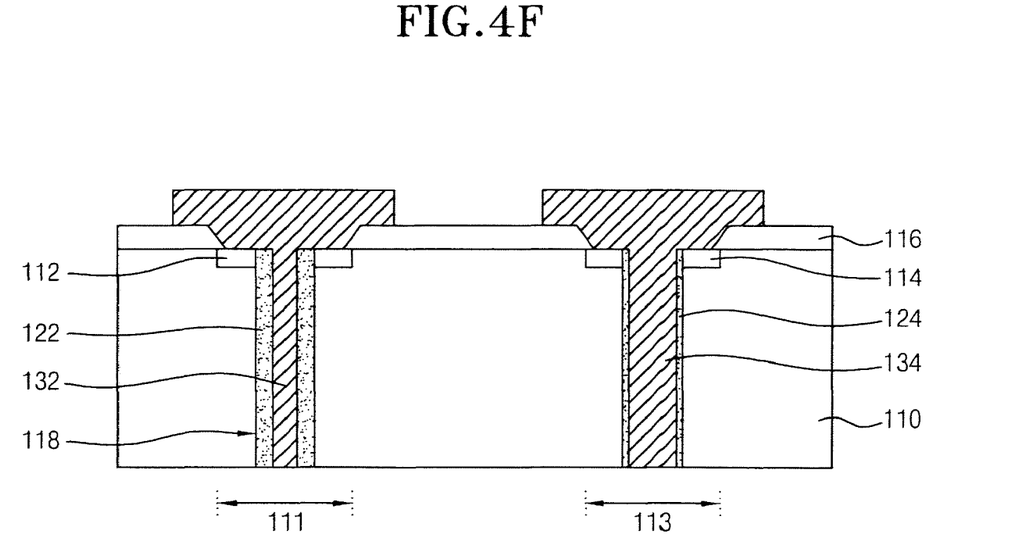

Referring to FIG. 4F, a conductive layer is formed on each semiconductor chip 110 of the wafer so as to be connected with the first and second bonding pads 112 and 114 and fill the grooves 118a defined in the first and second regions 111 and 113. Subsequently, portions of the conductive layer, which are filled in the grooves 118a, are electrically isolated from each other by conducting an etching process. Thereupon, first and second through-electrodes 132 and 134 are formed in the semiconductor chip 110 by conducting a back-grinding process on the lower surface of the wafer.

Thereafter, while not shown in the drawings, a cutting process is conducted on the wafer resulting in the formation of chip level semiconductor packages, whereby the manufacture of the semiconductor package according to the present embodiment is completed.

Figure 5:
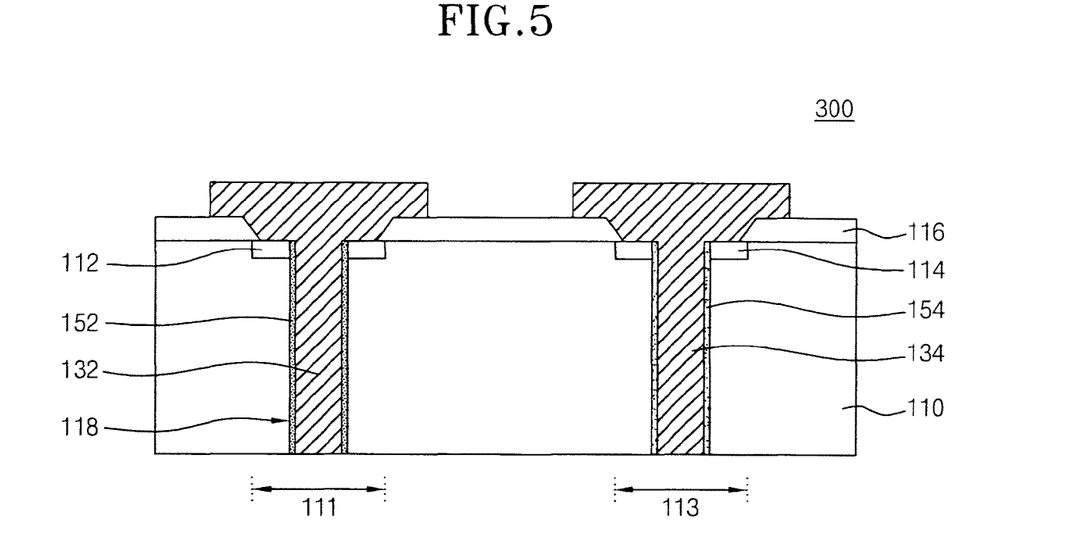
FIG. 5 is a cross-sectional view showing a semiconductor package in accordance with an embodiment of the present invention.

FIG. 5 is a cross-sectional view showing a semiconductor package in accordance with an embodiment of the present invention.

The semiconductor package shown in FIG. 5 includes substantially the same component elements as those of the semiconductor packages shown and explained with reference to FIGS. 2 and 3. Therefore, repeated description for the same component elements will be omitted, and the same technical terms and the same reference numerals will be used to refer to the same or like component elements.

Referring to FIG. 5, a semiconductor package 300 according to an embodiment of the present invention includes a semiconductor chip 110 having through-holes 118 of the same diameter defined therein. Insulation layers 152 and 154 are formed on the sidewalls of the through-holes 118 and through-electrodes 132 and 134 are formed in the through-holes 118. According to the present embodiment the insulation layers 152 and 154 are formed to have the same thickness but different dielectric constants.

The semiconductor chip 110 has a first region 111, including a first bonding pad 112 for transmitting signals, and a second region 113, including a second bonding pad 114 for transmitting power. The first insulation layer 152 is formed in the first region 111 and is made of an insulation material that has a dielectric constant less than that of the second insulation layer 154, which is formed in the second region 113. As such, the first insulation layer 152 has capacitance less than that of the second insulation layer 154.

The capacitance of a capacitor having a structure in which a conductive layer, an insulation layer, and a conductive layer are sequentially arranged, decreases as the dielectric constant of the insulation layer decreases. Accordingly, the signal transmission efficiency of the semiconductor package 300 is improved when transmitting signals through the first through-electrode 132 due to the first insulation layer 152 having a small dielectric constant, and the power transmission efficiency of the semiconductor package 300 is improved when transmitting power through the second through-electrode 134 due to the second insulation layer 154 having a large dielectric constant.

Figure 6:
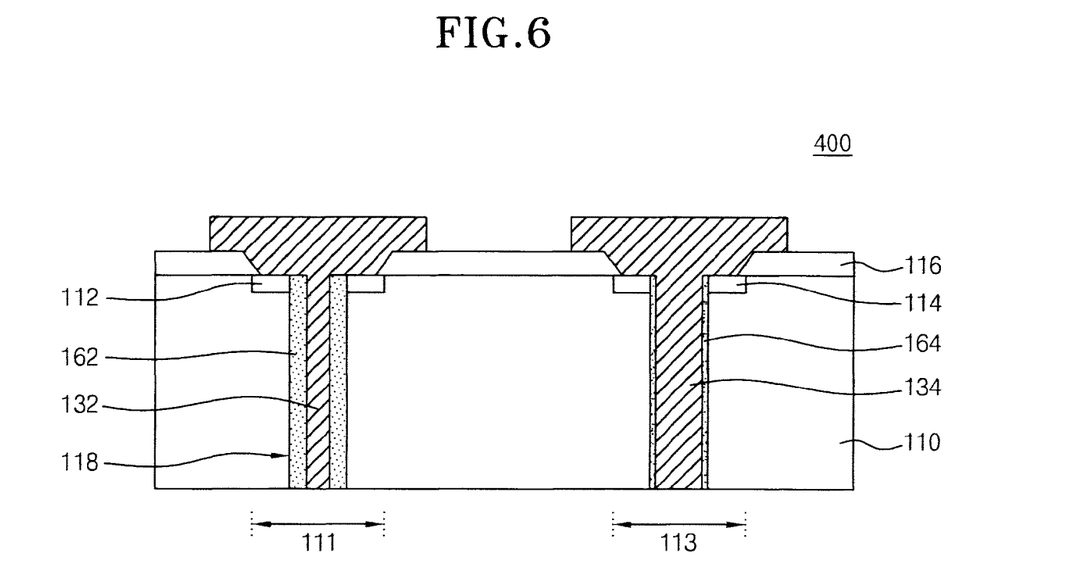
FIG. 6 is a cross-sectional view showing a semiconductor package in accordance with an embodiment of the present invention.

FIG. 6 is a cross-sectional view showing a semiconductor package in accordance with an embodiment of the present invention.

The semiconductor package shown in FIG. 6 includes substantially the same component elements as those of the semiconductor packages shown and explained with reference to FIGS. 2 and 5. Therefore, repeated description for the same component elements will be omitted, and the same technical terms and the same reference numerals will be used to refer to the same or like component elements.

Referring to FIG. 6, the semiconductor package 400 according to an embodiment includes a semiconductor chip 110 having through-holes 118 defined therein. Each of the through-holes 118 are defined so as to each have substantially the same diameter, and through-electrodes 132 and 134 are formed in the through-holes 118. Insulation layers 162 and 164 are formed on the sidewalls of the through-holes 118 and the insulation layers 162 and 164 have both different thicknesses and different dielectric constants.

The semiconductor chip 110 has a first region 111, including a first bonding pad 112 for transmitting signals, and a second region 113, including has a second bonding pad 114 for transmitting power. The first insulation layer 162 is formed in the first region 111 and is made of an insulation material that has a greater thickness than that of the second insulation layer 164, which is formed in the second region 113. Further a dielectric constant of the first insulation layer 162 is smaller than that of the second insulation layer. As such, since the first insulation layer 162 has both a greater thickness and a smaller dielectric constant than does the second insulation layer 164, the first insulation layer 162 has capacitance smaller than that of the second insulation layer 164.

Accordingly, the signal transmission efficiency of the semiconductor package 400 is improved when transmitting signals through the first through-electrode 132 due to the presence of the first insulation layer 162 having both a large thickness and a small dielectric constant when compared to the second insulation layer 164, and the power transmission efficiency of the semiconductor package 400 is improved when transmitting power through the second through-electrode 134 due to the second insulation layer 164 having a small thickness and a large dielectric constant, when compared to the first insulation layer 162.

Although not shown in the drawings, a semiconductor package having a stack structure may be formed by stacking the above-described semiconductor packages.

As is apparent from the above description, in the present invention, in order to improve the electrical characteristics of a semiconductor package, which are affected by capacitance caused by components within the semiconductor package, insulation layers surrounding through-electrodes are formed in different ways. That is to say, in order to decrease the capacitance of a through-electrode for signal transmission and increase the capacitance of a different through-electrode for power transmission, the insulation layer that surrounds the through-electrode for signal transmission is increased in thickness and/or formed of a material having a small dielectric constant, and similarly, the insulation layer that surrounds the through-electrode for power transmission is decreased in thickness and/or formed of a material having a large dielectric constant. As a consequence, as shown through embodiments of the present invention, a semiconductor package having improved characteristics for transmitting both signals and power may be realized.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
a semiconductor chip comprising a first region and a second region,
wherein bonding pads are formed in both the first region and the second region and through-holes are defined in both the first region and the second region;
insulation layers formed on sidewalls of the through-holes; and
through-electrodes formed within the through-holes and connected with corresponding bonding pads,
wherein the insulation layer formed in the first region has a thickness greater than that of the insulation layer formed in the second region, such that capacitance of the insulation layer formed in the first region is less than that of the insulation layer formed in the second region.

2. The semiconductor package according to claim 1, wherein the through-holes defined in the first and second regions have the same diameter.

3. The semiconductor package according to claim 1, wherein the insulation layers formed in the first region and the second region comprise the same material.

4. The semiconductor package according to claim 1, wherein the through-electrode formed in the first region is configured to transmit and the through-electrode formed in the second region is configured to transmit power.

5. The semiconductor package according to claim 1, wherein the through-holes are defined in the first and second regions pass through the corresponding bonding pads.

6. A semiconductor package comprising:
a semiconductor chip having a first region and a second region,
wherein bonding pads are formed in both the first region and the second region and through-holes are defined in both the first region and the second region;
insulation layers formed on sidewalls of the through-holes; and
through-electrodes formed within the through-holes and connected with corresponding bonding pads,
wherein the insulation layer formed in the second region comprises a material having a dielectric constant greater than that of the insulation layer in the first region, such that capacitance of the insulation layer in the first region is smaller than that of the insulation layer in the second region.

7. The semiconductor package according to claim 6, wherein the through-holes defined in the first and second regions have the same diameter.

8. The semiconductor package according to claim 6, wherein the insulation layers formed in the first and second regions have the same thickness.

9. The semiconductor package according to claim 6, wherein the through-electrode formed in the first region is configured to transmit signals, and the through-electrode formed in the second region is configured to transmit power.

10. The semiconductor package according to claim 6, wherein, the through-holes are defined in the first and second regions pass through the respective corresponding bonding pads.

11. A semiconductor package comprising:
a semiconductor chip having a first region and a second region,
wherein bonding pads are formed in both the first and second region and through-holes are defined in both the first and second region;
a first layer formed on sidewalls of the through-holes defined in the first region and the second region;
a second layer formed on the first layer in the first region; and
through-electrodes formed within the respective through-holes and connected with respective corresponding bonding pads,
wherein the first layer and the second layer are insulation layers, wherein the insulation layer formed in the first region comprises a stack layer of the first layer and the second layer and the insulation layer formed in the second region is formed of a single layer of the first layer, such that capacitance of the insulation layer formed in the first region is less than that of the insulation layer formed in the second region.

* * * * *